United States Patent
Choi et al.

(10) Patent No.: US 11,492,420 B2
(45) Date of Patent: Nov. 8, 2022

(54) COMPOSITE AND INFRARED ABSORBER, THIN FILM, PHOTOELECTRIC DEVICE, AND ELECTRONIC DEVICE INCLUDING SAME

(71) Applicants: Samsung Electronics Co., Ltd., Suwon-si (KR); California Institute of Technology, Pasadena, CA (US)

(72) Inventors: Yeong Suk Choi, Suwon-si (KR); Vincenzo Costanza, Pasadena, CA (US); Luca Bonanomi, Pasadena, CA (US); Chiara Daraio, South Pasadena, CA (US); Linghui Wang, Pasadena, CA (US); Tae Hyun Kim, Pasadena, CA (US); Zhun Zhou, Pasadena, CA (US)

(73) Assignees: Samsung Electronics Co., Ltd., Gyeonggi-do (KR); California Institute of Technology, Pasadena, CA (US)

( * ) Notice: Subject to any disclaimer, the term of this patent is extended or adjusted under 35 U.S.C. 154(b) by 0 days.

(21) Appl. No.: 16/935,300

(22) Filed: Jul. 22, 2020

(65) Prior Publication Data
US 2021/0024657 A1    Jan. 28, 2021

Related U.S. Application Data

(60) Provisional application No. 62/876,856, filed on Jul. 22, 2019.

(51) Int. Cl.
*C08J 5/18* (2006.01)
*C08B 37/00* (2006.01)
(Continued)

(52) U.S. Cl.
CPC ............ *C08B 37/0045* (2013.01); *C08J 5/18* (2013.01); *C08K 3/042* (2017.05);
(Continued)

(58) Field of Classification Search
CPC .. C08L 5/06; C08K 3/013; C08K 3/04; C08K 5/053; C08K 2201/001; C08K 3/041;
(Continued)

(56) References Cited

U.S. PATENT DOCUMENTS

| 5,186,051 A | 2/1993 | Stecher et al. |
| 5,834,776 A | 11/1998 | Beratan et al. |

(Continued)

FOREIGN PATENT DOCUMENTS

| CN | 104075813 A | 10/2014 |
| CN | 104695227 A | 6/2015 |

(Continued)

OTHER PUBLICATIONS

Tran Quang Trung et al., "Flexible and Stretchable Physical Sensor Integrated Platforms for Wearable Human-Activity Monitoring and Personal Healthcare", Advanced Materials, vol. 28, pp. 4338-4372, 2016.

(Continued)

*Primary Examiner* — Mark Kopec
*Assistant Examiner* — Jaison P Thomas
(74) *Attorney, Agent, or Firm* — Harness, Dickey & Pierce, P.L.C.

(57) ABSTRACT

A composite includes a polymer network including pectin or a pectin derivative; a low-molecular compound having a hydrophilic group in the polymer network; and a polyvalent metal ion coordinated with an anion present in the polymer chain of the polymer network.

22 Claims, 15 Drawing Sheets

(51) Int. Cl.
C08K 3/04 (2006.01)
H01L 51/00 (2006.01)
B29C 45/00 (2006.01)
H01L 27/30 (2006.01)
H01L 51/05 (2006.01)
H01L 51/42 (2006.01)

(52) U.S. Cl.
CPC ...... H01L 51/0093 (2013.01); B29C 45/0001 (2013.01); B29K 2005/00 (2013.01); C08J 2305/06 (2013.01); C08K 2201/001 (2013.01); H01L 27/307 (2013.01); H01L 51/0545 (2013.01); H01L 51/0566 (2013.01); H01L 51/4253 (2013.01)

(58) Field of Classification Search
CPC .......... C08K 3/042; C08K 3/045; C08K 3/22; B29C 45/0001; B29K 2005/00; C08B 37/0045; C08J 2305/06; C08J 5/18; H01L 27/307; H01L 51/0045; H01L 51/0093; H01L 51/0545; H01L 51/0566; H01L 51/4253
See application file for complete search history.

(56) References Cited

U.S. PATENT DOCUMENTS

| | | | |
|---|---|---|---|
| 6,497,902 B1* | 12/2002 | Ma | A61K 8/042 424/484 |
| 8,069,718 B2 | 12/2011 | Nakano et al. | |
| 9,243,943 B2 | 1/2016 | Moore et al. | |
| 9,274,004 B2 | 3/2016 | Yonemura et al. | |
| 10,090,466 B2 | 10/2018 | Chan et al. | |
| 10,345,153 B2 | 7/2019 | Daraio et al. | |
| 10,809,131 B2 | 10/2020 | Daraio et al. | |
| 2007/0295907 A1 | 12/2007 | Brott et al. | |
| 2013/0269781 A1* | 10/2013 | Ko | H01G 9/2018 136/263 |
| 2014/0267757 A1 | 9/2014 | Abramson et al. | |
| 2018/0080830 A1 | 3/2018 | Daraio et al. | |
| 2019/0284349 A1* | 9/2019 | Bassett | A61P 39/04 |
| 2019/0339298 A1 | 11/2019 | Bonanomi et al. | |
| 2020/0353729 A1 | 11/2020 | Bonanomi et al. | |

FOREIGN PATENT DOCUMENTS

| | | |
|---|---|---|
| CN | 107690571 A | 2/2018 |
| EP | 3274677 A1 | 1/2018 |
| JP | H02-232290 A | 9/1990 |
| JP | H09-230126 A | 9/1997 |
| KR | 10-2017-0110644 A | 10/2017 |
| WO | WO-2016/151110 A1 | 9/2016 |
| WO | WO-2019/217328 A1 | 11/2019 |

OTHER PUBLICATIONS

Alex Chortos et al., "Pursuing prosthetic electronic skin", Nature Materials, vol. 15, pp. 937-950, Jul. 4, 2016, DOI: 10.1038/NMAT4671.
Xiandi Wang et al., "Recent Progress in Electronic Skin". Advanced Science, vol. 2, No. 1500169, 2015.
Siegfried Bauer, "Sophisticated Skin", Flexible Electronics, Nature Materials, vol. 12, pp. 871-872, Oct. 2013.
J. K. Aggarwal et al., "Sensor Data Fusion in Robotic Systems", Control and Dynamic Systems, vol. 39 pp. 435-462, 1991.
Carlos Garcia Nunez et al., "Energy-Autonomous, Flexible, and Transparent Tactile Skin", Advanced Functional Materials, vol. 27, No. 1606287, 2017, DOI: 10.1002/adfm.201606287.
Jaemin Kim et al., "Stretchable silicon nanoribbon electronics for skin prosthesis", Nature Communications, vol. 5, No. 5747, pp. 1-11, Dec. 9, 2014, DOI: 10.1038/ncomms6747.
Tran Quang Trung et al., "An All-Elastomeric Transparent and Stretchable Temperature Sensor for Body-Attachable Wearable Electronics", Advanced Materials, vol. 28, pp. 502-509, 2016, DOI: 10.1002/adma.201504441.
Meital Segev-Bar et al., "Tunable Touch Sensor and Combined Sensing Platform: Toward Nanoparticle-based Electronic Skin", ACS Applied Materials & Interfaces, vol. 5, pp. 5531-5541, 2013, DOI: 10.1021/am400757q.
Jonghwa Park et al., "Fingertip skin-inspired microstructured ferroelectric skins discriminate static/dynamic pressure and temperature stimuli", Nanomaterials, Science Advances, 1.9, e1500661, pp. 1-13, Oct. 30, 2015.
B. P. Mason et al., "A temperature-mapping molecular sensor for polyurethane-based elastomers", Applied Physics Letters, vol. 108, No. 041906, Jan. 27, 2016, DOI: 10.1063/1.4940750.
Cunjiang Yu et al., "A stretchable temperature sensor based on elastically buckled thin film devices on elastomeric substrates", Applied Physics Letters, vol. 95, No. 141912, Oct. 8, 2009, DOI: 10.1063/1.3243692.
Tomoyuki Yokota et al., "Ultraflexible, large-area, physiological temperature sensors for multipoint measurements", PNAS, vol. 112, No. 47, p. 14533-14538, Nov. 24, 2015, DOI: 10.1073/pnas.1515650112.
Jin Jeon et al., "Flexible Wireless Temperature Sensors Based on Ni Microparticle-Filled Binary Polymer Composites", Advanced Materials, vol. 25. pp. 850-855, 2013, DOI: 10.1002/adma.201204082.
Raffaele Di Giacomo et al., "Biomimetic temperature-sensing layer for artificial skins", Science Robotics, vol. 2, eaai9251, pp. 1-6, Feb. 1, 2017.
Wojciech Plazinski, "Molecular Basis of Calcium Binding by Polyguluronate Chains. Revising the Egg-Box Model", Journal of Computational Chemistry, pp. 2988-2995, 2011, DOI: 10.1002/jcc.21880.
Paula Judith Perez Espitia et al., "Edible films from pectin: Physical-mechanical and antimicrobial properties—A review", Food Hydrocolloids, vol. 35, pp. 287-296, 2014, DOI: 10.1016/j.foodhyd.2013.06.005.
Susana M. Cardoso et al., "Temperature dependence of the formation and melting of pectin-$Ca^{2+}$ networks: a rheological study", Food Hydrocolloids, vol. 17, pp. 801-807, 2003, DOI: 10.1016/S0268-005X(03)00101-2.
Raffaele Di Giacomo et al., "Plant nanobionic materials with a giant temperature response mediated by pectin-$Ca^{2+}$", PNAS, vol. 112, No. 15, pp. 4541-4545, Apr. 14, 2015, DOI: 10.1073/pnas.1421020112.
Giuseppe Cantarella et al., "Design of Engineered Elastomeric Substrate for Stretchable Active Devices and Sensors", Advanced Functional Materials. vol. 28, No. 1705132, 2018, DOI: 10.1002/adfm.201705132.
Jeong-Yun Sun et al., "Ionic Skin", Advanced Materials, vol. 26. pp. 7608-7614, 2014, DOI: 10.1002/adma.201403441.
Christoph Keplinger et al., "Stretchable, Transparent, Ionic Conductors", Science, vol. 341, No. 6149, Aug. 30, 2013, pp. 984-987, DOI: 10.1126/science.1240228.
Mohammed Aider, "Chitosan application for active bio-based films production and potential in the food industry: Review", LWT—Food Science and Technology, vol. 43, pp. 837-842, 2010, DOI: 10.1016/j.lwt.2010.01.021.
Melissa Gurgel Adeodato Vieira et al., "Natural-based plasticizers and biopolymer films: A review", European Polymer Journal, vol. 47, pp. 254-263. 2011, DOI: 10.1016/j.eurpolymj.2010.12.011.
S.D. Pasini Cabello et al., "Influence of plasticizers in pectin films: Microstructural changes", Materials Chemistry and Physics, vol. 162, pp. 491-497, 2015, DOI: 10.1016/j.matchemphys.2015.06.019.
Mariana Altenhofen da Silva et al., "Alginate and pectin composite films crosslinked with $Ca^{2+}$ ions: Effect of the plasticizer concentration", Carbohydrate Polymers, vol. 77, pp. 736-742, 2009, DOI: 10.1016/j.carbpol2009.02.014.
G.O. Machado et al., "Influence of plasticizer contents on the properties of HEC-based solid polymeric electrolytes", Electrochimica Acta, vol. 50. pp. 3827-3831, 2005, DOI: 10.1016/j.elecacta.2005.02.041.

(56) References Cited

OTHER PUBLICATIONS

Rokeya Huq et al., "Influence of plasticizers on the electrochemical and chemical stability of a $Li^+$ polymer electrolyte", Solid State Ionics, vol. 57, pp. 277-283, 1992.
L. R. A. K. Bandara et al., "Ionic conductivity of plasticized $(PEO)-LiCF_3SO_3$ electrolytes", Electrochimica Acta, vol. 43, Nos. 10-11, pp. 1447-1451, 1998.
S. Gao et al., "Temperature dependence of conductivity enhancement induced by nanoceramic fillers in polymer electrolytes", Applied Physics Letters, vol. 102, No. 173903, 2013, DOI: 10.1063/1.4803185.
Xinming Qian et al., "Plasticizer effect on the ionic conductivity of PEO-based polymer electrolyte", Materials Chemistry and Physics, vol. 74, pp. 98-103, 2002.
Charles W. Walker Jr., et al., "Improvement of Ionic Conductivity in Plasticized PEO-Based Solid Polymer Electrolytes", J. Electrochem. Soc., vol. 140, No. 12, Dec. 1993, pp. 3409-3412.
Yuki Masuda et al., "Study on ionic conductivity of polymer electrolyte plasticized with PEG-aluminate ester for rechargeable lithium ion battery", Solid State Ionics, vol. 177, pp. 843-846, 2006, DOI: 10.1016/j.ssi.2006.01.049.
G.K. Prajapati et al., "Effect of plasticizer on ionic transport and dielectric properties of $PVA-H_3PO_4$ proton conducting polymeric electrolytes", Journal of Physics and Chemistry of Solids, vol. 71, pp. 1717-1723, 2010, DOI: 10.1016/j.jpcs.2010.08.023.
Wang Ning et al., "N, N-dimethylacetamide/lithium chloride plasticized starch as solid biopolymer electrolytes", Carbohydrate Polymers. Vol. 77, pp. 607-611, 2009, DOI: 10.1016/j.carbpol.2009.02.002.
Pradeep K. Varshney et al., "Natural polymer-based electrolytes for electrochemical devices: a review", Ionics, vol. 17, pp. 479-483, 2011, DOI: 10.1007/s11581-011-0563-1.
Juliana R. Andrade et al., "Plasticized pectin-based gel electrolytes", Electrochimica Acta, vol. 54, pp. 6479-6483, 2009, DOI: 10.1016/j.electacta.2009.05.098.
Dimitrios Fessas et al., "Water properties in wheat flour dough I: Classical thermogravimetry approach", Food Chemistry, vol. 72, pp. 237-244, 2001.
Jordi Saldo et al., "Changes in water binding in high-pressure treated cheese, measured by TGA (thermogravimetrical analysis)", Innovative Food Science and Emerging Technologies, vol. 3, pp. 203-207, 2002.
Alessia Lodi et al., "Physical properties and water state changes during storage in soy bread with and without almond", Food Chemistry, vol. 110, pp. 554-561, 2008, DOI: 10.1016/j.foodchem.2008.02.032.
Yubin Wang et al., "Measurement of free water in foods by secondary derivative thermogravimetry", CyTA—Journal of Food, vol. 16, No. 1, pp. 438-443, 2018, DOI: 10.1080/19476337.2017.1416675.
Vincenzo Costanza et al., "Effect of glycerol on the mechanical and temperature-sensing properties of pectin films", Applied Physics Letters, vol. 115, No. 193702, 2019, DOI: 10.1063/1.5121710.
International Search Report and Written Opinion dated Jun. 27, 2016 for corresponding Application No. PCT/EP2016/056642.
International Search Report and Written Opinion dated Aug. 23, 2019 for corresponding Application No. PCT/US2019/030941.
Chinese Office Action dated Jan. 22, 2019 for corresponding Chinese Application No. 201680030032.3, and English-language translation thereof.
Chinese Office Action dated Jul. 5, 2019, for corresponding Chinese Application No. 201680030032.3, and partial English-language translation thereof.
Chinese Office Action dated Mar. 16, 2020 for corresponding Chinese Application No. 201680030032.3, and English-language translation thereof.
Chinese Notification for Going through Patent Registration Formalities and Notification of Grant dated Jun. 30, 2020 for corresponding Chinese Application No. 201680030032.3, and English-language translation thereof.
European Communication pursuant to Article 94(3) EPC dated Nov. 26, 2019 for corresponding European Application No. 16715264.4.
International Preliminary Report on Patentability dated Sep. 26, 2017 for corresponding Application No. PCT/EP2016/056642.
European Search Report dated Jul. 20, 2016 for corresponding European Appl. No. 15195729.
European Communication pursuant to Article 94(3) EPC dated Mar. 1, 2022 for corresponding European Application No. 16715264.4.

\* cited by examiner

COMPOSITE AND INFRARED ABSORBER, THIN FILM, PHOTOELECTRIC DEVICE, AND ELECTRONIC DEVICE INCLUDING SAME

CROSS-REFERENCE TO RELATED APPLICATION

This application claims priority to and the benefit of U.S. Provisional Patent Application No. 62/876,856 filed in the United States Patent and Trademark Office on Jul. 22, 2019, the entire contents of which are incorporated herein by reference.

BACKGROUND

1. Field

A composite and an infrared absorber, a thin film, a photoelectric device, and an electronic device including the same are disclosed.

2. Description of the Related Art

The recent development of portable and smart electronics has changed the way humans interact and communicate with electronic devices. For example, intimate contact between humans and electronic devices has continuously been improving, with anticipation that, in the near future, wearable electronic devices may act as a second skin for humans to interact and communicate with other humans and electronics for various applications.

As a result, deformable electronic materials (e.g., polymer semiconductor materials) that are able to be stretched similarly to human skin and are able to endure various human motions have attracted increasing attention.

SUMMARY

Some example embodiments provide a composite capable of simultaneously satisfying mechanical properties, electrical properties, and stretchability.

Some example embodiments provide an infrared absorber, a thin film, a photoelectric device, and an electronic device including the composite.

According to some example embodiments, a composite includes a polymer network including pectin or a pectin derivative; a low-molecular compound having a hydrophilic group in the polymer network; and a polyvalent metal ion coordinated with an anion present in a polymer chain of the polymer network.

The polymer chain may be included in the composite in an amount of greater than or equal to about 50 volume % and less than or equal to about 99 volume % based on a total volume of the composite.

In the low-molecular compound having the hydrophilic group, the hydrophilic group may be a hydroxyl group, a carboxyl group, an ester group, an ether group, an amine group, an amino group, an isocyanate group, or a urethane group.

The low-molecular compound having the hydrophilic group may be an organic compound in which at least one hydrophilic group is bound to a linear or branched C1 to C30 alkane, C3 to C30 cycloalkane, C3 to C30 heterocycloalkane, C6 to C30 arene, or C3 to C30 heteroarene. The at least one hydrophilic group may include the hydrophilic group of the low-molecular compound.

The low-molecular compound having the hydrophilic group may be ethylene glycol, propylene glycol, butylene glycol, diethylene glycol, dipropylene glycol, glycerol, or a combination thereof.

The low-molecular compound having the hydrophilic group may have a molecular weight of less than or equal to about 500 g/mol.

The low-molecular compound having the hydrophilic group may be included in the composite in an amount of greater than or equal to about 0.1 volume % and less than or equal to about 45 volume % based on a total volume of the composite.

The polyvalent metal ion may be a divalent or trivalent metal ion. Specific examples of the polyvalent metal ion may include Ca, Al, Cu, Co, Ba, Zn, Fe, Mn, Mg, Sr, Ba, Cr, Ti, Zr, Mo, V, or a combination thereof.

The polyvalent metal ion may be included in the composite in an amount of greater than or equal to about 0.1 volume % and less than or equal to about 5 volume % based on a total volume of the composite.

The composite may further include a reinforcing agent, and the reinforcing agent may include graphite, carbon nanotubes, graphene, graphite nanoplates, fullerene, fullerene derivatives, quantum dots, metal oxides, or combinations thereof.

The reinforcing agent may be included in the composite in an amount of less than or equal to about 5 volume % based on a total volume of the composite.

According to some example embodiments, an infrared absorber, a thin film, a photoelectric device, and an electronic device including the composite are provided.

Since the composite improves stretchability while maintaining improved charge mobility and electrical properties, it may be usefully applied to electronic devices requiring high stretchability and healing ability.

DETAILED DESCRIPTION

Figure 1:
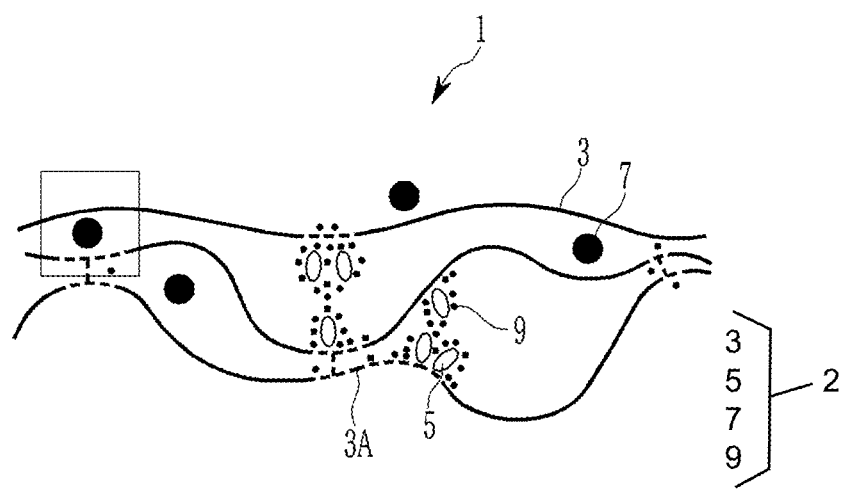
FIG. 1 is a schematic view of a composite according to some example embodiments.

Advantages and features of the technology described hereinafter, and a method of achieving them will be clarified by referring to some example embodiments described below in detail together with the accompanying drawings. However, example embodiments should not be construed as being limited to the example embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. Terms defined in a commonly used dictionary may be interpreted as having meanings consistent with their meanings in the related technical field and the context of the present specification, and may not be interpreted as idealized and excessively formal meanings, unless specifically defined herein. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness is enlarged to clearly represent various layers and regions. The same reference numerals are used for similar portions throughout the specification.

In the present specification, when a first element such as a layer, film, region, plate, etc. is said to be "on" the second element, this includes not only the case of being "directly on" the other portion but also another portion in the middle (e.g., being "indirectly on" the other portion). In contrast, when an element is referred to as being "directly on" another element, there are no intervening elements present. It will be understood that an element that is "on" another element may be "above" or "beneath" the other element.

As used herein, when a definition is not otherwise provided, "substituted" refer to replacement of hydrogen of a compound or a functional group by a substituent selected from a halogen atom, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C1 to C20 alkoxy group, a C1 to C20 haloalkyl group, a C2 to C20 alkenyl group, a C2 to C20 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

In addition, when a definition is not otherwise provided, "hetero" means that one or three heteroatoms selected from N, O, S, Si, Se, Te, and P are included in a given group or compound.

Hereinafter, "combination" includes two or more mixing, two or more lamination structures, or inter-substitution.

It will be understood that any elements and/or properties thereof as described herein (e.g., amounts) should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

It will be understood that some or all of any of the devices according to any of the example embodiments as described herein may be included in, may include, and/or may be implemented by one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the devices according to any of the example embodiments as described herein, including any of the methods of operating any of same.

Hereinafter, a composite according to some example embodiments is described with reference to FIGS. 1 and 2.

Figure 2:
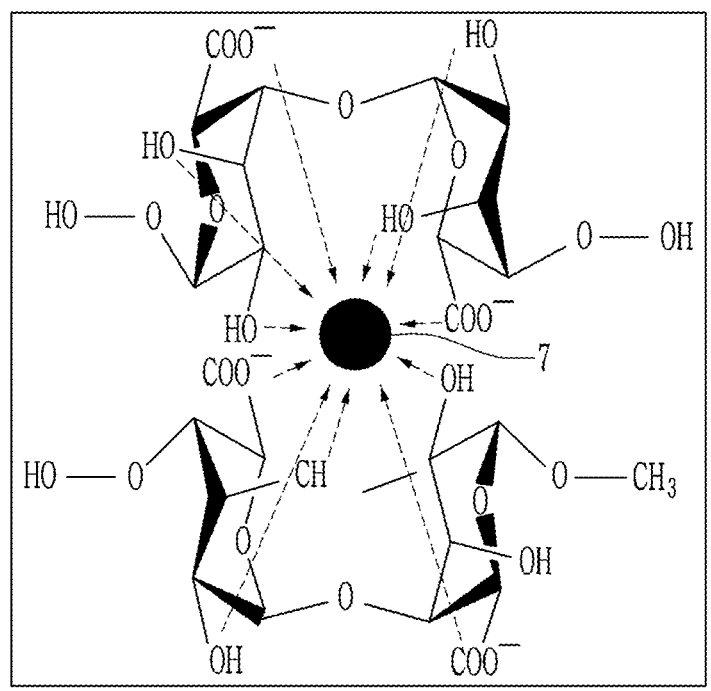
FIG. 2 is a view showing a coordination bonding state of the polymer constituting the composite and the polyvalent metal ion.

FIG. 1 is a schematic view of a composite according to some example embodiments and FIG. 2 is a view showing a coordination bonding state of the polymer constituting the composite and the polyvalent metal ion.

Referring to FIG. 1, a composite 1 according to some example embodiments, also referred to interchangeably as a composite material or composite compound, includes a polymer network 2 including pectin or a pectin derivative; a low-molecular compound 5 having a hydrophilic group in the polymer network 2 (e.g., dispersed in the polymer network 2); and a polyvalent metal ion 7 coordinated with an anion present in the backbone (e.g., polymer chain 3) of the polymer network 2. In some example embodiments, the polymer network 2 may be understood to include one or more polymer chains 3 as a part of the polymer network 2. In some example embodiments, the polymer network 2 may be understood to include the low-molecular compound 5 as a part of the polymer network 2. In some example embodiments, the low-molecular compound 5 may be understood to not be a part of the polymer network 2, such that the low-molecular compound 5 may be understood to be a separate part of the composite 1 in relation to the polymer network 2. In some example embodiments, the polymer network 2 may be understood to include the polyvalent metal ion 7 as a part of the polymer network 2. In some example embodiments, the polyvalent metal ion 7 may be understood to not be a part of the polymer network 2, such that the polyvalent metal ion 7 may be understood to be a separate part of the composite 1 in relation to the polymer network 2.

The pectin or pectin derivative is a polymer produced by condensation bonding of galacturonic acid and substituted galacturonic acid.

The pectin or pectin derivative may have a weight average molecular weight of greater than or equal to about 3,000, for example greater than or equal to about 4000, greater than or equal to about 5000, greater than or equal to about 6000, greater than or equal to about 7000, greater than or equal to about 8000, greater than or equal to about 9000, or greater than or equal to about 10000 and less than or equal to about 3,000,000, less than or equal to about 2,900,000, less than or equal to about 2,800,000, less than or equal to about 2,700,000, less than or equal to about 2,600,000, or less than or equal to about 2,500,000. When used in the above range, the coating property of the composition for preparing the composite may be easily adjusted.

The polymer network 2 may include a polymer chain 3 of a homopolymer of pectin or pectin derivative.

The pectin or pectin derivative may be homogalacturonan, rhamonogalacturonan (I and II), xylogalacturonan and arabinogalactan.

The carboxyl group of galacturonic acid constituting the pectin or pectin derivative may be esterified. Therefore, the pectin may be low-methoxyl (LM) pectin, high-methoxyl (HM) pectin, amidated high-methoxyl pectin, amidated low-methoxyl pectin, or a combination thereof. The low-methoxyl pectin refers to pectin in which less than about 50% of the carboxyl groups are esterified. The high-methoxyl pectin means pectin in which about 50% or greater of the carboxyl groups are esterified. In some example embodiments, about 20% or greater, for example about 25% or greater, or about 30% or greater, and about 60% or greater, and about 55% or less, about 50% or less, or about 45% or less of the carboxyl groups are esterified.

The esterification of the carboxyl groups may affect formation of the polymer network 2 and the esterified chains may be formed by cross-linking by hydrogen bonding and hydrophobic interactions. The chains that are not esterified and include carboxyl groups (charged moieties) may form a hydrophilic region with increased intermolecular attraction of the polymer chain 3 and may retain water molecules 9 in a hydrophilic region. In some example embodiments, the polymer network 2 may be understood to include the water molecules 9 as a part of the polymer network 2. In some example embodiments, the water molecules 9 may be understood to not be a part of the polymer network 2, such that the water molecules 9 may be understood to be a separate part of the composite 1 in relation to the polymer network 2.

The polymer chain 3 of the polymer network 2 may form coordinate bonds by electrostatic interactions with polyvalent metal ions (cations) described later. As shown in FIG. 1, an area (shown by a square) in which coordination bonds are formed is enlarged and is illustrated in FIG. 2. As shown in FIG. 2, the coordination bond between the carboxylate group (COO⁻) of the polymer chain 3 (e.g., an anion present in the polymer chain 3) and the polyvalent metal ions 7 forms junction zones between neighboring chains.

The cross-linking structure as described above may impart high charge mobility to the composite 1 by rearranging the polymer chain 3 of the polymer network 2 and polyvalent metal ions 7 according to ambient conditions (for example, temperature), thereby improving the conductivity of the composite 1.

A content of the polymer chain 3 forming the polymer network 2 may be greater than or equal to about 50 volume %, for example, greater than or equal to about 55 volume %, greater than or equal to about 60 volume %, greater than or equal to about 65 volume %, or greater than or equal to about 70 volume % based on a total volume of the composite. In addition, the content of the polymer chain 3 may be less than or equal to about 99 volume %, for example 95 volume %, less than or equal to about 90 volume %, less than or equal to about 85 volume % or less than or equal to about 80 volume % based on a total volume of the composite. Restated, the polymer network 2 may include a polymer chain 3 that is included in the composite 1 in an amount of greater than or equal to about 50 volume %, greater than or equal to about 55 volume %, greater than or equal to about 60 volume %, greater than or equal to about 65 volume %, or greater than or equal to about 70 volume % based on a total volume of the composite, and the polymer chain 3 may be included in the composite 1 in an amount of less than or equal to about 99 volume %, for example 95 volume %, less than or equal to about 90 volume %, less than or equal to about 85 volume % or less than or equal to about 80 volume % based on a total volume of the composite. Within the above range, mechanical and electrical properties of the composite 1 may be easily controlled.

Since the thin film including the pectin is not stretchable, it is difficult to apply to electronic skin (e-skins) and wearable electronic devices that require flexibility and stretchability. In some example embodiments, the low-molecular compound 5 having the hydrophilic group is introduced to impart flexibility and stretchability to the composite 1.

In the low-molecular compound 5 having the hydrophilic group, the hydrophilic group may be a hydroxyl group, a carboxyl group, an ester group, an ether group, an amine group, an amino group, an isocyanate group, or a urethane group. The low-molecular compound 5 having the hydrophilic group acts as a plasticizer and may impart flexibility and stretchability of the polymer network 2 without inhibiting the properties of the polymer network 2.

The low-molecular compound 5 having the hydrophilic group has a small molecular weight and is present in an intermolecular space between polymer chains 3 in the polymer network 2 to form hydrogen bonds, and reduces interaction between polymer chains 3 to increase charge mobility of the polymer chains 3.

The low-molecular compound 5 having the hydrophilic group may react with a carboxyl group or hydroxyl group present in the polymer chains 3 of the polymer network 2 to form a covalent bond. For example, a low-molecular compound including the hydroxyl group as a hydrophilic group may form an ester bond by reacting with a carboxylic acid in the polymer chains 3 (e.g., hydroxyl-hydroxyl or hydroxyl-carbonyl condensation reactions). In addition, the low-molecular compound including an isocyanate group as a hydrophilic group may react with hydroxyl groups in the polymer chain 3 to form urethane bonds.

The low-molecular compound 5 having the hydrophilic group may allow a large amount of water molecules 9 to be retained in the polymer network 2. When a large amount of water is retained in the polymer network 2, charge mobility may be improved and temperature responsivity.

The low-molecular compound 5 having the hydrophilic group screens the hydrophilic portion 3A of the polymer chain 3 by solvating the polar sites of the polymer chain 3, thereby decreasing the intermolecular attraction of the polymer chain 3. This makes the composite 1 have flexibility and has a reduced electrical resistance.

The low-molecular compound 5 having the hydrophilic group may be an alcohol compound, a carboxylic acid compound, an ester compound, an ether compound, an amine compound, an isocyanate compound, a urethane compound, or a combination thereof.

The low-molecular compound 5 having the hydrophilic group may be an organic compound in which at least one hydrophilic group (which may include the hydrophilic group) is bound to a linear or branched C1 to C30 alkane, C3 to C30 cycloalkane, C3 to C30 heterocycloalkane, C6 to C30 arene, or C3 to C30 heteroarene.

The alcohol compound may be an alcohol compound including at least one hydroxyl group in a linear or branched alkane, for example, a polyhydric alcohol compound. Examples of the polyhydric alcohol compound may be dihydric alcohol such as ethylene glycol, propylene glycol, butylene glycol, diethylene glycol, dipropylene glycol, and the like or trihydric alcohol such as glycerol, and the like. Accordingly, the low-molecular compound 5 having the hydrophilic group may be ethylene glycol, propylene glycol, butylene glycol, diethylene glycol, dipropylene glycol, glycerol, or a combination thereof.

The low-molecular compound 5 having the hydrophilic group may have a molecular weight of less than or equal to about 500 g/mol, less than or equal to about 450 g/mol, less than or equal to about 400 g/mol, less than or equal to about 350 g/mol, less than or equal to about 300 g/mol, less than or equal to about 250 g/mol, less than or equal to about 240 g/mol, less than or equal to about 230 g/mol, less than or equal to about 220 g/mol, less than or equal to about 210 g/mol, or less than or equal to about 200 g/mol. The low-molecular compound 5 having the hydrophilic group having a molecular weight within the above range may be in (e.g., dispersed in) the polymer network 2 to effectively reduce the intermolecular attraction between polymer chains 3.

A content of the low-molecular compound 5 having the hydrophilic group may be greater than or equal to about 0.1 volume %, for example greater than or equal to about 0.2 volume %, greater than or equal to about 0.3 volume %, greater than or equal to about 0.4 volume %, or greater than or equal to about 0.5 volume % based on a total volume of the composite. In addition, the content of the low-molecular compound 5 having the hydrophilic group may be less than or equal to about 45 volume %, for example less than or equal to about 40 volume %, less than or equal to about 35 volume %, less than or equal to about 30 volume %, less than or equal to about 25 volume %, less than or equal to about 20 volume %, less than or equal to about 15 volume %, or less than or equal to about 10 volume % based on a total volume of the composite. Restated, the low-molecular compound 5 may be included in the composite 1 in an amount of greater than or equal to about 0.1 volume %, greater than or equal to about 0.2 volume %, greater than or equal to about 0.3 volume %, greater than or equal to about 0.4 volume %, or greater than or equal to about 0.5 volume % based on a total volume of the composite, and the low-molecular compound 5 may be included in the composite 1 in an amount of less than or equal to about 45 volume %, less than or equal to about 40 volume %, less than or equal to about 35 volume %, less than or equal to about 30 volume %, less than or equal to about 25 volume %, less than or equal to about 20 volume %, less than or equal to about 15 volume %, or less than or equal to about 10 volume % based on a total volume of the composite. Within the above ranges, it is possible to effectively reduce the interchain bond of the polymer to impart high stretchability, mechanical properties, and electrical properties to the composite 1.

The polyvalent metal ion 7 may form a coordination bond through electrostatic interaction with the polymer chain 3 of the polymer network 2 (e.g., with an anion present in the polymer chain 3). The polyvalent metal ion 7 may be a divalent metal ion or a trivalent metal ion. Specific examples of the polyvalent metal ion 7 include Ca, Al, Cu, Co, Ba, Zn, Fe, Mn, Mg, Sr, Ba, Cr, Ti, Zr, Mo, V, or a combination thereof. Restated, the polyvalent metal ion 7 may include (e.g., may be) Ca, Al, Cu, Co, Ba, Zn, Fe, Mn, Mg, Sr, Ba, Cr, Ti, Zr, Mo, V, or a combination thereof.

A content of the polyvalent metal ion 7 may be greater than or equal to about 0.1 volume %, for example greater than or equal to about 0.2 volume %, greater than or equal to about 0.3 volume %, greater than or equal to about 0.4 volume %, or greater than or equal to about 0.5 volume % based on a total volume of the composite 1. In addition, the content of the polyvalent metal ion 7 may be less than or equal to about 5 volume %, for example, less than or equal to about 4.5 volume %, less than or equal to about 4.0 volume %, less than or equal to about 3.5 volume %, or less than or equal to about 3.0 volume % based on a total volume of the composite 1. Restated, the polyvalent metal ion 7 may be included in the composite 1 in an amount that is greater than or equal to about 0.1 volume %, greater than or equal to about 0.2 volume %, greater than or equal to about 0.3 volume %, greater than or equal to about 0.4 volume %, or greater than or equal to about 0.5 volume % based on a total volume of the composite 1, and the polyvalent metal ion 7 may be included in the composite 1 in an amount that is less than or equal to about 5 volume %, less than or equal to about 4.5 volume %, less than or equal to about 4.0 volume %, less than or equal to about 3.5 volume %, or less than or equal to about 3.0 volume % based on a total volume of the composite 1. Within the above ranges, flexibility, stretchability, and electrical properties of the composite 1 may be improved.

The composite 1 may further include a reinforcing agent for improving (e.g., configured to improve) mechanical properties (e.g., mechanical properties of the composite 1 and/or a device including same). The reinforcing agent may include graphite, carbon nanotube, graphene, graphite nanoplates, fullerene, fullerene derivatives, quantum dots, metal oxides (e.g., silica, alumina ($Al_2O_3$), titania ($TiO_2$), zirconia ($ZrO_2$), ZnO, $SnO_2$, $Sb_2O_3$, boehmite, indium tin oxide (ITO), etc.), or a combination thereof. In some example embodiments, the reinforcing agent may desirably have a spherical shape.

For example, the quantum dots may include a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof.

The reinforcing agent may be in (e.g., dispersed in) the polymer network 3.

The reinforcing agent may be used (e.g., included in the composite 1) in an amount of greater than or equal to about 0.1 volume %, greater than or equal to about 0.2 volume %, greater than or equal to about 0.3 volume %, greater than or equal to about 0.4 volume %, or greater than or equal to about 0.5 volume % based on a total volume of the composite 1. The reinforcing agent may be used (e.g., included in the composite 1) in an amount of less than or equal to about 5 volume %, less than or equal to about 4.5 volume %, less than or equal to about 4.0 volume %, less than or equal to about 3.5 volume %, or less than or equal to about 3.0 volume % based on a total volume of the composite 1. In some example embodiments where the reinforcing agent is included in the composite in the amounts of the above range, the electrical properties of the composite 1 may be improved.

The composite may be produced in a thin film form. The thin film may be produced by a process in which a salt of the polyvalent metal is dissolved in the low-molecular compound having the hydrophilic group to obtain a solution, the solution is mixed with a solution of the pectin or pectin derivative to prepare a composition, and the composition is coated on a substrate, followed by drying the same.

The low-molecular compound having the hydrophilic group and pectin or pectin derivative are the same as described above.

The solution of the pectin or pectin derivative may be obtained by dispersing the pectin or pectin derivative in a solvent such as water, alcohol (e.g., methanol, ethanol, propanol, butanol, etc.).

The salt of the polyvalent metal may include halides, carboxylates, acetylacetonates, hydroxides, nitrates, sulfates, or combinations thereof including a polyvalent metal, but is not limited thereto. The polyvalent metal may be a divalent or trivalent metal. Specific examples of the polyvalent metal include Ca, Al, Cu, Co, Ba, Zn, Fe, Mn, Mg, Sr, Ba, Cr, Ti, Zr, Mo, V, or a combination thereof.

The substrate may be, for example, a glass substrate or a polymer substrate, and the polymer substrate may be made of, for example, polyethylene terephthalate, polyethylene naphthalate, polycarbonate, polyacrylate, polyimide, or a combination thereof, but is not limited thereto.

The coating of the composition on the substrate may be performed, for example, by spin coating, slit coating, bar coating, dip coating, spray coating, inkjet printing, etc., but is not limited thereto. In some example embodiments, the composition may be coated, for example, by spin coating.

The thin film may be transferred on an elastic substrate (e.g. SEBS), for example, by contacting the thin film with the elastic substrate to transfer it thereon and then, removing the elastic substrate.

The aforementioned composite has excellent flexibility, stretchability, and the like, excellent charge mobility and electrical conductivity, and excellent absorption in a long wavelength region, for example, in an infrared region of about 1 micrometer (μm) to about 20 micrometers (μm). Accordingly, the composite may be used as an infrared absorber (e.g. in a form of a thin film) and thus applied to a photoelectric device and an organic sensor which sense infrared light. In addition, since the composite has improved temperature responsivity, in the case that the composite is applied to a device, the device may be miniaturized because a cooler for improving the temperature sensitivity is not required.

The aforementioned composite may be applied to various electronic devices. For example, the thin film type composite may be applied as a charge transport layer and/or a photoelectric conversion layer (active layer) or an infrared light absorbing film in electronic devices such as thin film transistors, photodetectors, photoelectric devices, solar cells, organic light emitting diode displays, and organic sensors. In addition, the electronic device may be a stretchable organic light emitting diode (OLED), a stretchable human motion sensor, a stretchable artificial muscle, or a stretchable actuator.

Figure 3:
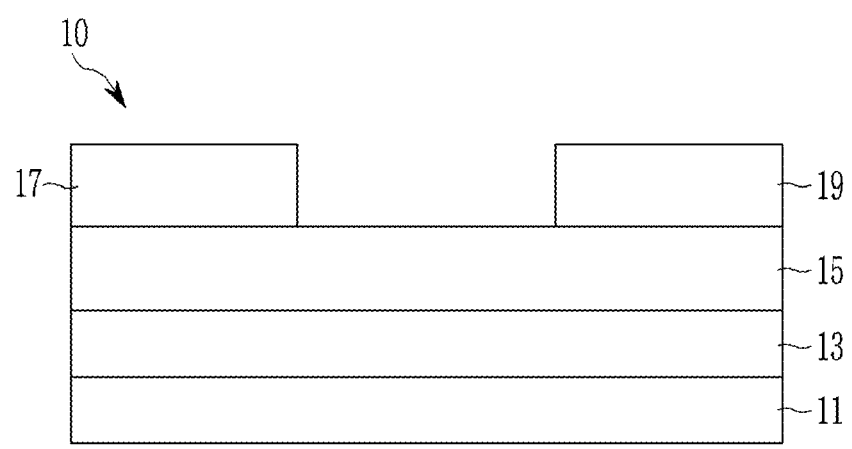
FIG. 3 is a schematic cross-sectional view of a thin film transistor according to some example embodiments.

Hereinafter, an example of a thin film transistor including the composite is described with reference to FIG. 3. FIG. 3 is a schematic cross-sectional view of a thin film transistor according to some example embodiments.

Referring to FIG. 3, a thin film transistor 10 includes a substrate 11, an insulation layer 13, a semiconductor layer 15, a source electrode 17, and a drain electrode 19.

The substrate 11 may include a gate electrode, or may serve as a gate electrode as a whole. The substrate 11 may be made of transparent glass, silicon, or plastic. The gate electrode may be formed through internal doping of the silicon substrate at a high concentration or a conductive layer (e.g., a metal layer or a CNT layer formed of gold (Au), copper (Cu), nickel (Ni), aluminum (Al), molybdenum (Mo), chromium (Cr), tantalum (Ta), titanium (Ti), an alloy thereof, or a combination thereof) disposed on an insulating substrate (e.g., a rubber such as PDMS, SEBS, and the like and a polymer substrate such as polyester, polycarbonate, polyimide, and the like).

The insulation layer 13 is disposed on the substrate 11. The insulation layer 13 separates the gate electrode, the source electrode 17, the drain electrode 19, and the semiconductor layer 15. The insulation layer 13 may be an inorganic material thin film or an organic polymer film. Examples of the inorganic material may include silicon oxide, silicon nitride, aluminum oxide, barium titanate, and the like, but are not limited thereto. Examples of the organic polymer include polyester, polycarbonate, poly(vinyl phenol), polyimide, polystyrene, poly(methacrylate), poly(acrylate), an epoxy resin, and the like, but are not limited thereto. In addition, when the thin film including the composite is transferred on the elastic substrate, the elastic substrate may play a role of an insulation layer. In some example embodiments, the insulation layer 13 may include a thin film that includes the aforementioned composite 1.

A thickness of the insulation layer 13 may vary depending on a dielectric constant of an insulating material but is not particularly limited. For example, the insulation layer 13 may have a thickness of greater than or equal to about 10 nm, for example, greater than or equal to about 50 nm, or greater than or equal to about 100 nm, but is not limited thereto. The insulation layer 13 may have a thickness of less than or equal to about 2000 nm, for example, less than or equal to about 500 nm, but is not limited thereto. The insulation layer 13 may have conductivity of less than or equal to about $10^{-12}$ S/cm, but is not limited thereto.

On the insulation layer 13, the semiconductor layer 15 is disposed and may include the aforementioned composite 1. In some example embodiments, the semiconductor layer 15 may be a thin film that includes the aforementioned composite 1.

On the semiconductor layer 15, the source electrode 17 and the drain electrode 19 electrically connected to the semiconductor layer 15 are disposed.

Examples of materials for the source electrode 17 and the drain electrode 19 include a metal such as gold (Au), copper (Cu), nickel (Ni), aluminum (Al), molybdenum (Mo), chromium (Cr), tantalum (Ta), titanium (Ti), an alloy thereof, and the like, a conductive polymer, and a conductive ink, but are not limited thereto. Thicknesses of the source electrode 17 and drain electrode 19 may be appropriately determined.

Herein, the thin film transistor may, for example, have a top contact/bottom gate structure but is not limited thereto but equally have all other structures such as a bottom contact/top gate structure, a bottom contact/bottom gate structure, or a top contact/top gate structure.

The thin film transistor including the composite may work as a switching element or a driving element of various electronic devices. In some example embodiments, the electronic devices may be stretchable electronic devices. For example, the electronic devices may be stretchable organic light emitting diode (OLED) displays, stretchable human motion sensors, stretchable artificial muscles, prosthetics, or stretchable actuators.

In some example embodiments, the aforementioned composite may be applied to a photoelectric device.

Hereinafter, a photoelectric device according to some example embodiments is described with reference to FIG. 4.

Figure 4:
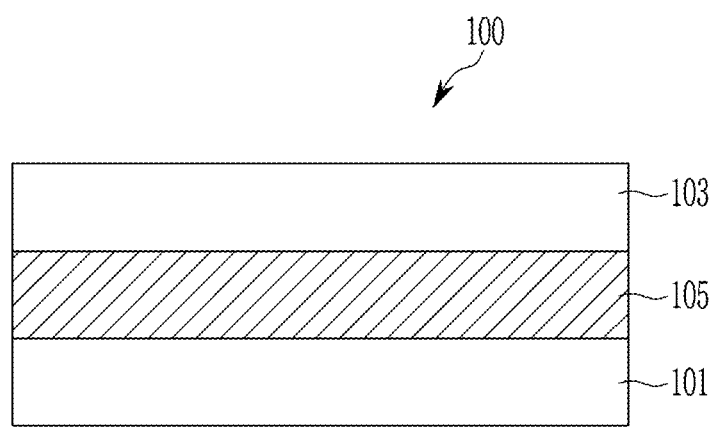
FIG. 4 is a cross-sectional view showing a photoelectric device according to some example embodiments.

FIG. 4 is a cross-sectional view showing a photoelectric device according to some example embodiments.

Referring to FIG. 4, an photoelectric device 100 according to some example embodiments includes a first electrode 101 and a second electrode 103 facing each other, and a photoelectric conversion layer 105 between the first electrode 101 and the second electrode 103.

One of the first electrode 101 or the second electrode 103 may be an anode, and the other may be a cathode. One of the first electrode 101 or the second electrode 103 may be a light-transmitting electrode, and the light-transmitting electrode may be made of, for example, a transparent conductor such as indium tin oxide (ITO) or indium zinc oxide (IZO), or a metal thin layer of a thin monolayer or a multilayer. When one of the first electrode 101 or the second electrode 103 is an opaque electrode, it may be made of an opaque conductor such as aluminum (Al).

The photoelectric conversion layer 105 is a layer including a p-type semiconductor compound and an n-type semiconductor compound to form a bulk heterojunction (BHJ), which receives light from outside to generate excitons, and then separates the generated excitons into holes and electrons.

In some example embodiments, one or more, or all (e.g., any) of the layers 101, 103, and 105 of the photoelectric device 100 may include the composite 1. For example, the photoelectric conversion layer 105 may include the composite 1.

Hereinafter, a photoelectric device according to some example embodiments is described with reference to FIG. 5.

Figure 5:
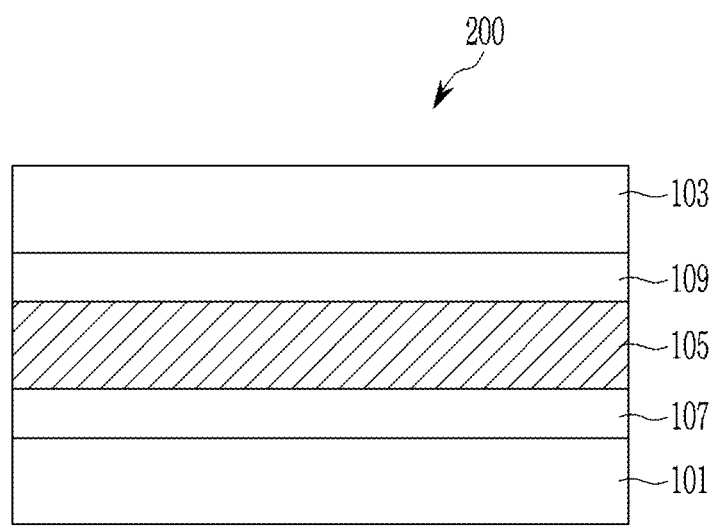
FIG. 5 is a cross-sectional view showing a photoelectric device according to some example embodiments.

FIG. 5 is a cross-sectional view showing a photoelectric device according to some example embodiments.

Referring to FIG. 5, a photoelectric device 200 according to some example embodiments includes a first electrode 101 and a second electrode 103 facing each other, and a photoelectric conversion layer 105 between the first electrode 101 and the second electrode 103, like some example embodiments, including the example embodiments shown in FIG. 4.

However, the photoelectric device 200 according to some example embodiments, including the example embodiments show in FIG. 5, unlike some example embodiments, including the example embodiments shown in FIG. 4, the charge auxiliary layers 107 and 109 may be disposed between the first electrode 101 and the photoelectric conversion layer 105 and between the second electrode 103 and the photoelectric conversion layer 105, respectively. The charge auxiliary layers 107 and 109 may make holes and electrons separated in the photoelectric conversion layer 105 be transported easily to improve efficiency.

The charge auxiliary layers 107 and 109 may include at least one selected from a hole injection layer (HIL) for facilitating hole injection, a hole transport layer (HTL) for facilitating hole transport, an electron blocking layer (EBL) for preventing electron transport, an electron injection layer (EIL) for facilitating electron injection, an electron transport layer (ETL) for facilitating electron transport, and a hole blocking layer (HBL) for preventing hole transport.

The charge auxiliary layers 107 and 109 may include, for example, an organic material, an inorganic material, or an organic/inorganic material. The organic material may be an organic material having hole or electron characteristics and the inorganic material may be for example a metal oxide such as a molybdenum oxide, a tungsten oxide, or a nickel oxide.

One of the charge auxiliary layers 107 or 109 may be omitted.

In some example embodiments, one or more, or all (e.g., any) of the layers 101, 103, 105, 107, and 109 of the photoelectric device 200 may include the composite 1. For example, the photoelectric conversion layer 105 may include the composite 1.

The photoelectric device 100 and/or 200 may be applied to (e.g., included in) an organic cell, a solar cell, an image sensor, a photodetector, and a photosensor, but is not limited thereto.

The organic sensor may be an organic CMOS sensor, for example an organic CMOS infrared light sensor or an organic CMOS image sensor.

Figure 6:
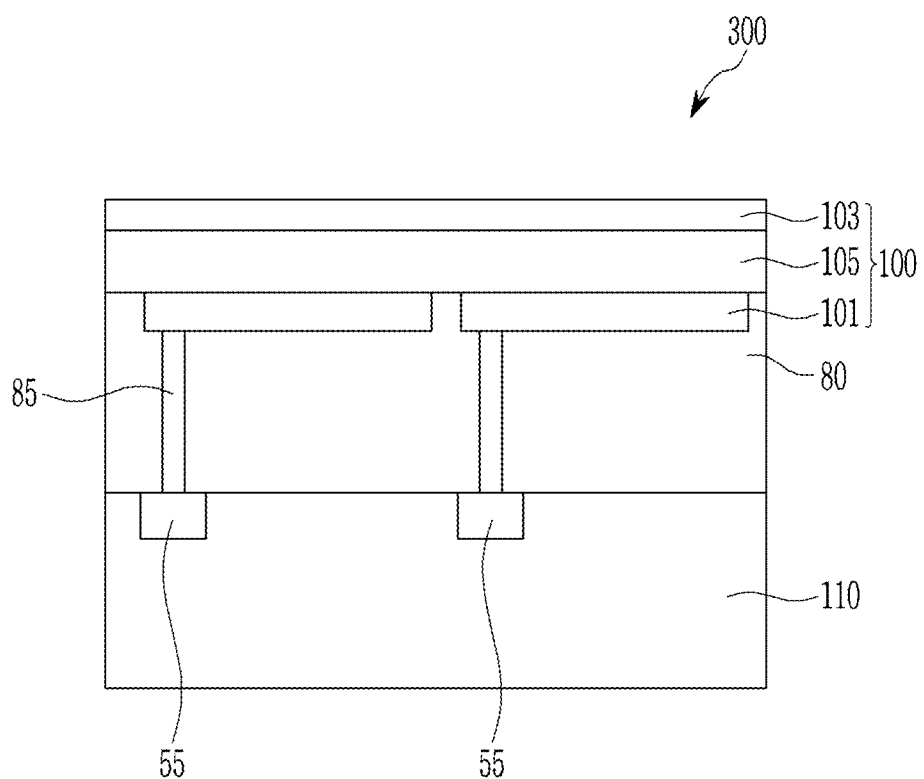
FIG. 6 is a cross-sectional view showing an example of an organic sensor according to some example embodiments.

FIG. 6 is a cross-sectional view showing an example of an organic sensor according to some example embodiments.

The organic sensor 300 according to some example embodiments includes a semiconductor substrate 110, an insulation layer 80, and a photoelectric device 100.

The semiconductor substrate 110 may be a silicon substrate and is integrated with a transmission transistor (not shown) and a charge storage 55. The charge storage 55 may be integrated in each pixel. The charge storage 55 is electrically connected to the photoelectric device 100 that will be described later and information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the semiconductor substrate 110.

The insulation layer 80 is formed on the metal wire and pad. The insulation layer 80 may be made of an inorganic insulating material such as a silicon oxide and/or a silicon nitride, or a low dielectric constant (low K) material such as SiC, SiCOH, SiCO, and SiOF. The insulation layer 60 has a trench 85 exposing the charge storage 55. The trench 85 may be filled with fillers.

The aforementioned photoelectric device 100 is formed on the insulation layer 80. As described above, the photoelectric device 100 includes a first electrode 101, a second electrode 103, and a photoelectric conversion layer 105.

The first electrode 101 and the second electrode 103 may both be transparent electrodes, and the photoelectric conversion layer 105 is the same as described above. The photoelectric conversion layer 105 may selectively absorb light in the infrared wavelength range. The light incident from the second electrode 103 side may have high absorbance characteristics in the infrared wavelength range by the photoelectric conversion layer 105, and thus, may exhibit good photoelectric conversion characteristics.

FIG. 6 illustrates an example including the photoelectric device of FIG. 4, but is not limited thereto, and may include the photoelectric device of FIG. 5.

In some example embodiments, one or more, or all (e.g., any) of the elements 110, 55, 80, 85, 101, 103, and 105 of organic sensor 300 may include the composite 1. For example, the photoelectric conversion layer 105 may include the composite 1.

Focusing lens (not shown) may be further formed on the photoelectric device 100. The focusing lens may control a direction of incident light and gather the light in one region. The focusing lens may have a shape of, for example, a cylinder or a hemisphere, but is not limited thereto.

The organic sensor according to some example embodiments may be an organic infrared light sensor, for example an iris sensor or a depth sensor.

The iris sensor identifies a person by using unique iris characteristics of every person and specifically, taking an image of an eye of a user within an appropriate distance, processing the image, and comparing it with his/her stored image.

The depth sensor identifies a shape and a location of an object from its three-dimensional information by taking an image of the object within an appropriate distance with a user and processing the image. This depth sensor may be, for example, used as a face recognition sensor.

Figure 7:
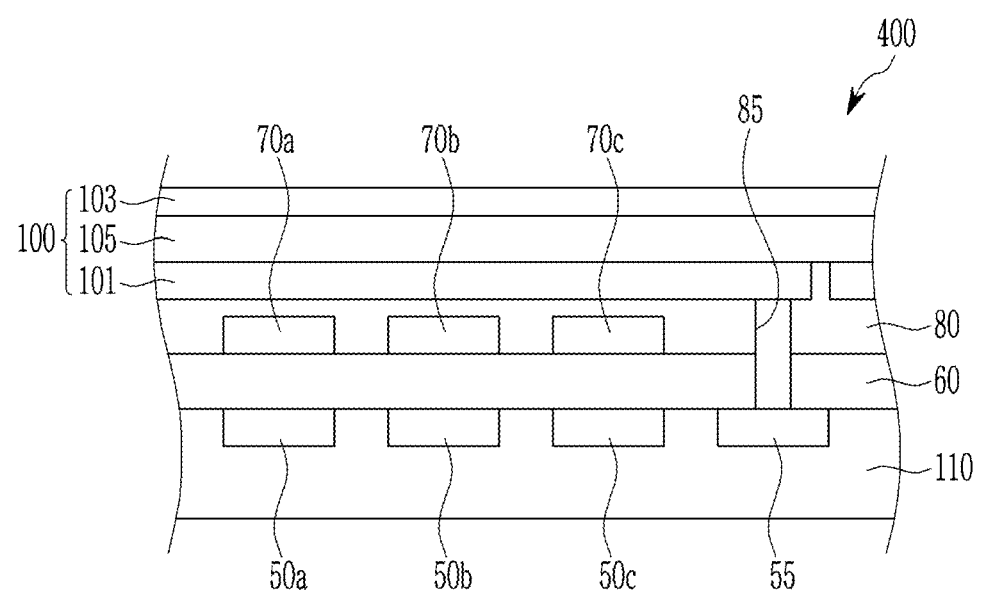
FIG. 7 is a cross-sectional view showing an organic sensor according to some example embodiments.

FIG. 7 is a cross-sectional view showing an example of an organic sensor according to some example embodiments.

An organic sensor according to some example embodiments may be an organic CMOS image sensor.

Referring to FIG. 7, an organic sensor 400 according to some example embodiments includes a semiconductor substrate 110 integrated with photo-sensing devices 50a, 50b, and 50c, a transmission transistor (not shown), and a charge storage 55, a lower insulation layer 60, color filters 70a, 70b, and 70c, an upper insulation layer 80, and a photoelectric device 100.

The semiconductor substrate 110 may be integrated with photo-sensing devices 50a, 50b, and 50c, a transmission transistor (not shown), and a charge storage 55. The photo-sensing devices 50a, 50b, and 50c may be photodiodes.

The photo-sensing devices 50a, 50b, and 50c, the transmission transistor, and/or the charge storage 55 may be integrated in each pixel. For example, the photo-sensing device 50a may be included in a red pixel, the photo-sensing device 50b may be included in a green pixel, and the photo-sensing device 50c may be included in a blue pixel.

The photo-sensing devices 50a, 50b, and 50c sense light, the information sensed by the photo-sensing devices may be transferred by the transmission transistor, the charge storage 55 is electrically connected to the photoelectric device 100 (also referred to herein as a photoelectric diode) that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the photo-sensing devices 50a and 50b.

The lower insulation layer 60 is formed on the metal wire and the pad.

Color filters 70a, 70b, and 70c are formed on the lower insulation layer 60. The color filters 70a, 70b, and 70c includes a red filter 70a formed in a red pixel, a green filter 70b formed in a green pixel, and a blue filter 70c formed in a blue pixel.

The upper insulation layer 80 is formed on the color filters 70a, 70b, and 70c. The upper insulation layer 80 eliminates steps caused by the color filters 70a, 70b, and 70c and planarizes the surface. The upper insulation layer 80 may have a same material composition as the insulation layer 80 of the organic sensor 300 shown in FIG. 6.

The aforementioned photoelectric device 100 is formed on the upper insulation layer 80. As described above, the photoelectric device 100 includes a first electrode 101, a photoelectric conversion layer 105, and a second electrode 103. Even though a structure in which the first electrode 101, the photoelectric conversion layer 105, and the second electrode 103 are sequentially stacked is shown as an example in the drawing, the present disclosure is not limited to this structure, and the second electrode 103, the photoelectric conversion layer 105, and the first electrode 101 may be arranged in this order.

FIG. 7 illustrates an example including the photoelectric device of FIG. 4, but is not limited thereto, and may include the photoelectric device of FIG. 5.

In some example embodiments, one or more, or all (e.g., any) of the elements 110, 50a-50c, 60, 80, 85, 70a-70c, 101, 103, 105, and 110 of organic sensor 400 may include the composite 1. For example, the photoelectric conversion layer 105 may include the composite 1.

The first electrode 101 and the second electrode 103 may both be transparent electrodes and the photoelectric conversion layer 105 is the same as described above. The photoelectric conversion layer 105 may selectively absorb light in an infrared wavelength region.

Incident light from the side of the second electrode 103 may be photoelectrically converted by mainly absorbing light in an infrared wavelength region in the photoelectric conversion layer 105. Light in the remaining wavelength region may pass through the first electrode 101 and the color filters 70a, 70b, and 70c, the light in a red wavelength region passing through the color filter 70a may be sensed by the photo-sensing device 50a, the light in a green wavelength region passing through the color filter 70b may be sensed by the photo-sensing device 50b, and the light in a blue wavelength region passing through the color filter 70c may be sensed by the photo-sensing device 50c.

The aforementioned organic sensor may be applied to (e.g., included in) various electronic devices, for example and the electronic devices may include for example a camera, a camcorder, a mobile phone internally having them, a display device, a security device, or a medical device, but are not limited thereto. Accordingly, in some example embodiments, an electronic device may include the composite 1.

Hereinafter, some example embodiments are illustrated in more detail with reference to examples. However, the example embodiments are not limited to these examples.

EXAMPLES

Example 1: Production of Thin Film Including Composite

Low-methoxyl (LM) pectin (34% degree of methylation) powder is dissolved in deionized water at a concentration of 2 wt % at 80° C. and then, stirred until a uniform pectin solution is obtained. A 32 mM $CaCl_2$) solution and glycerol as a low-molecular compound are mixed to prepare a CaCl₂/glycerol solution. A content of the glycerol is adjusted to be 2.5 volume % in a final thin film. The pectin aqueous solution is injected into a mold, and the CaCl₂/glycerol solution is added thereto for gelation. A thin film obtained after the gelation reaction is dried at room temperature overnight.

Examples 2 to 4: Production of Thin Film Including Composite

Thin films are formed according to the same method as Example 1 except that the content of glycerol is changed into 5 volume %, 7.5 volume %, and 10 volume % in final thin films.

Examples 5 to 8: Production of Thin Film Including Composite

Thin films are formed according to the same method as Example 1 except that $CuCl_2$ is used instead of the $CaCl_2$).

Example 9: Production of Thin Film Including Composite

Low-methoxyl (LM) pectin (34% degree of methylation) powder is dissolved in deionized water at a concentration of 2 wt % at 80° C. and then, stirred until a uniform pectin solution is obtained. Graphite is dispersed in glycerol to prepare graphite dispersion. A 32 mM $CaCl_2$ solution and glycerol as a low-molecular compound are mixed to prepare a $CaCl_2$/glycerol solution. The prepared graphite dispersion and the $CaCl_2$/glycerol solution are mixed to prepare a mixture. A content of the graphite is adjusted to be 0.1 volume % in a final thin film, and a content of glycerol is adjusted to be 2.5 volume % in the final thin film. The pectin aqueous solution is injected into a mold, and the mixture is added thereto for gelation. A thin film obtained after the gelation reaction is dried at room temperature overnight.

Example 10: Production of Thin Film Including Composite

A thin film is formed according to the same method as Example 9 except that the content of graphite is changed into 1 volume % in a final thin film.

Comparative Example 1: Production of Thin Film Including Composite

A thin film is formed according to the same method as Example 1 except that the glycerol is not used.

Comparative Example 2: Production of Thin Film

A vanadium oxide is deposited to form a thin film.

Comparative Example 3: Production of Thin Film

A thin film is formed by dispersing polyvinyl alcohol in water at a concentration of 1.5 wt % and then, coating and drying it.

Evaluations
Evaluation 1: Mechanical Strength

Figure 8:
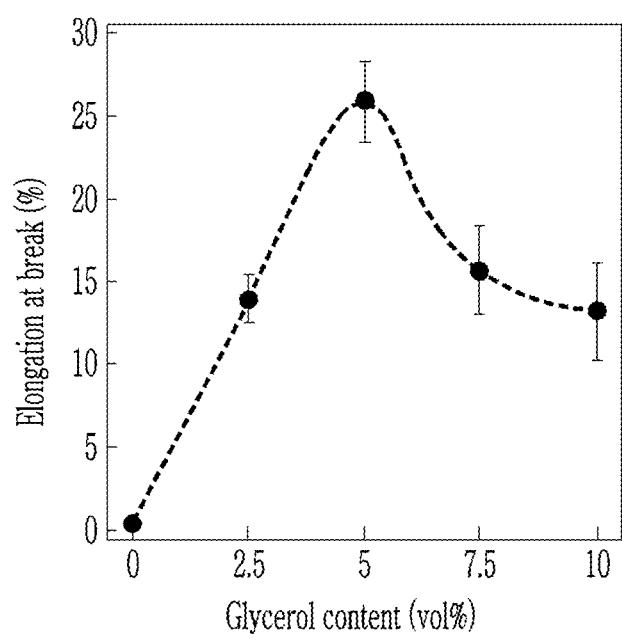
FIG. 8 is a graph showing elongation at break of the thin films according to Comparative Example 1 and Examples 1 to 4.

The thin films according to Examples 1 to 10 and Comparative Examples 1 to 3 are cut into a size of 6 cm×1 cm to obtain rectangular samples, and a tensile testing machine (Instron E3000, Instron) is used to measure tensile strength thereof. A tensile strength test is performed at 0.1%/s until the samples are fractured to obtain a stress-strain graph (curve) and calculate an elongation at break therefrom. The test results of Comparative Example 1 and Examples 1 to 4 are shown in FIG. 8. FIG. 8 is a graph showing the elongations at break of the thin films according to Comparative Example 1 and Examples 1 to 4. Referring to FIG. 8, the thin film including no glycerol according to Comparative Example 1 exhibits greatly increased elongation at break compared with the thin films according to Examples 1 to 4.

Evaluation 2: Water Uptake

The thin films of Examples 1 to 10 and Comparative Examples 1 to 3 are respectively prepared into five square samples (area: 1 cm²) and dehydrated in an oven for 6 hours, and after measuring weights of the dehydrated thin films, deionized water is absorbed in the dehydrated thin films overnight. Water remaining after the absorption is removed to calculate water uptakes according to Equation 1.

$$W_{uptake} = \frac{w_t - w_0}{w_0} \quad \text{[Equation 1]}$$

In Equation 1, $w_0$ is a weight of a dehydrated thin film, and $w_t$ is a weight of a hydrated thin film.

Figure 9:
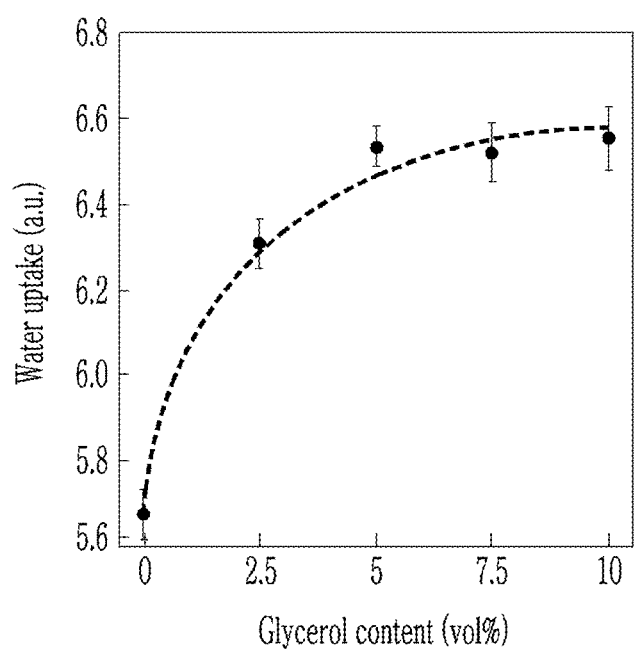
FIG. 9 is a graph showing water uptake of the thin films according to Comparative Example 1 and Examples 1 to 4.

The water uptakes of the thin films of Comparative Example 1 and Examples 1 to 4 are shown in FIG. 9. FIG. 9 is a graph showing water uptake of the thin films according to Comparative Example 1 and Examples 1 to 4. Referring to FIG. 9, the thin film including no glycerol according to Comparative Example 1 exhibits greatly increased water uptake compared with the thin films according to Examples 1 to 4. Accordingly, the thin films of Examples 1 to 4 exhibit excellent charge mobility compared with the thin film according to Comparative Example 1.

Evaluation 3: Electrical Conductivity

The thin films according to Examples 1 to 10 and Comparative Examples 1 to 3 are respectively disposed between two carbon electrodes (area: 1 cm²) to measure impedance by using a MFIA impedance analyzer made by Zurich Instruments AG. Conductivity of the thin films is calculated according to Equation 2.

$$\sigma_b = \frac{d}{R_b A} \quad \text{[Equation 2]}$$

wherein, in Equation 2, $R_b$ is bulk resistance, d is a thickness of a thin film, and A is an area of the thin film.

Figure 10:
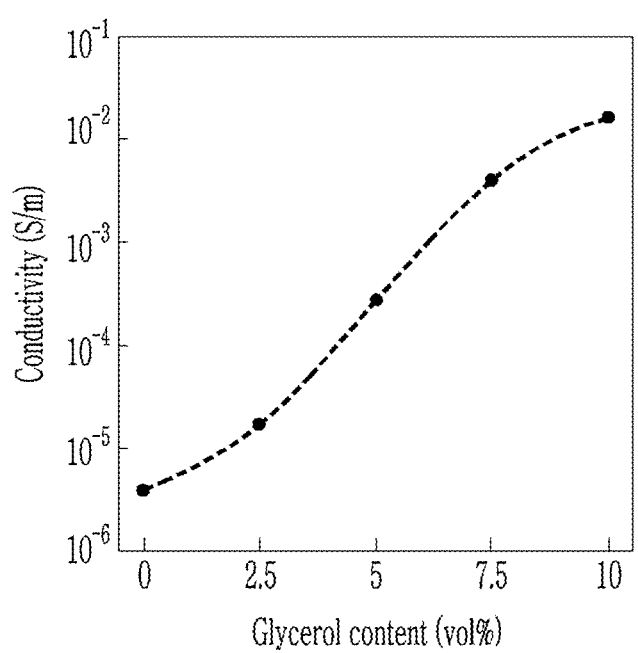
FIG. 10 is a graph showing the conductivity of the thin films according to Comparative Example 1 and Examples 1 to 4.

Conductivity of the thin films according to Comparative Example 1 and Examples 1 to 4 is shown in FIG. 10. FIG. 10 is a graph showing the conductivity of the thin films according to Comparative Example 1 and Examples 1 to 4. Referring to FIG. 10, the thin films including no glycerol according to Examples 1 to 4 exhibit greatly increased conductivity compared with the thin film according to Comparative Example 1.

Evaluation 4: Temperature Responsivity

The thin films according to Examples 1 to 10 and Comparative Examples 1 to 3 are respectively electrically connected to carbon tapes to measure a current depending on a temperature change by using a 2-channel source meter (KEITHLEY 2636B).

Figure 11:
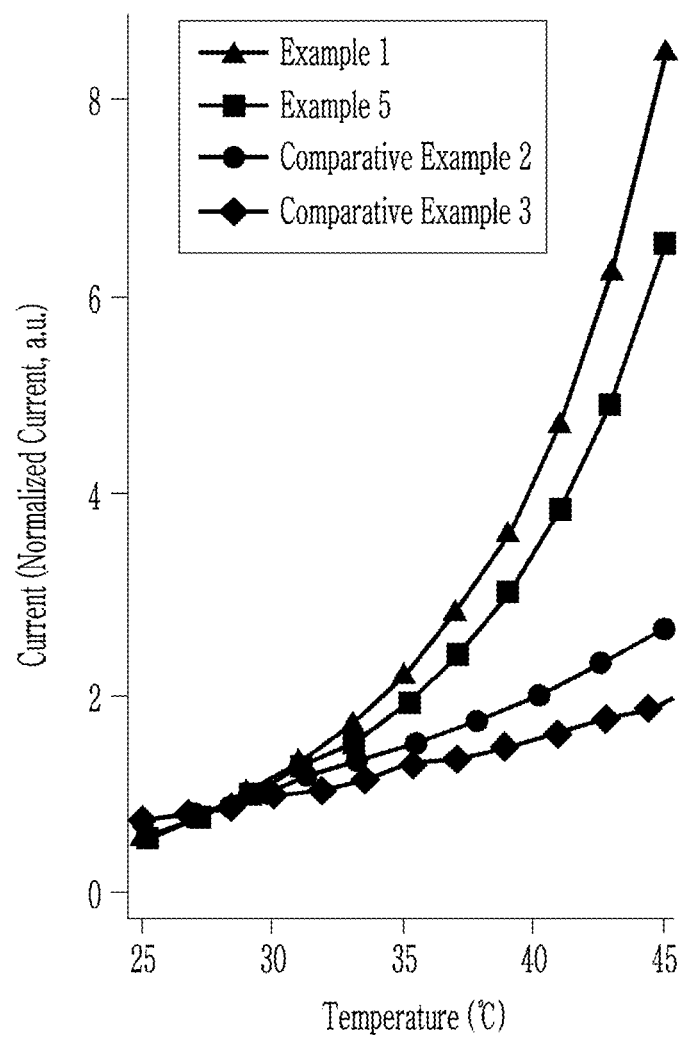
FIG. 11 is a graph showing current measurement results according to temperature changed of the thin films according to Example 1, Example 5, Comparative Example 2 and Comparative Example 3.

The current measurement results of the thin films according to Examples 1 and 5 and Comparative Examples 2 and 3 are shown in FIG. 11. FIG. 11 is a graph showing current measurement results according to temperature changed of the thin films according to Examples 1 and 5 and Comparative Examples 2 and 3. Referring to FIG. 11, the thin films of Examples 1 and 5 exhibit improved temperature responsivity compared with the thin films of Comparative Examples 2 and 3.

Figure 12A:
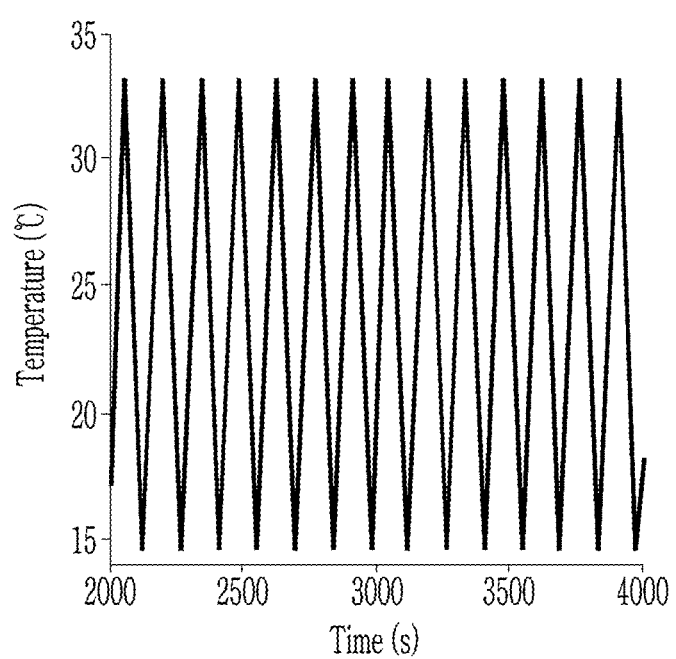
FIG. 12A is a view showing a cycle of temperature change applied to the thin film according to Example 1 and FIG. 12B is a view showing the detected currents thereof.
Figure 12B:
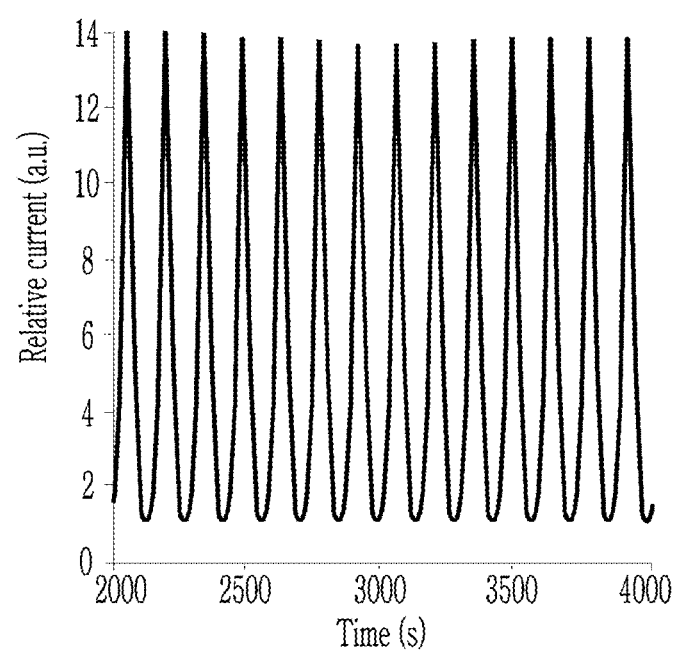

When the temperature change is 40000 cycles performed, currents detected in the thin films are measured and then, shown in FIGS. 12A and 12B. FIG. 12A is a view showing a cycle of temperature change applied to the thin film according to Example 1, and FIG. 12B is a view showing the detected currents thereof. Referring to FIGS. 12A and 12B, the same current curve as the temperature change cycle is detected, and the thin film of Example 1 exhibits excellent current detection intensity depending on the temperature change.

The thin films according to Examples 1 to 10 and Comparative Examples 1 to 3 are respectively electrically connected to carbon tapes to measure TCR (temperature coefficient of resistance) depending on the temperature change by using a 2-channel source meter (Keithley 2636B).

Figure 13:
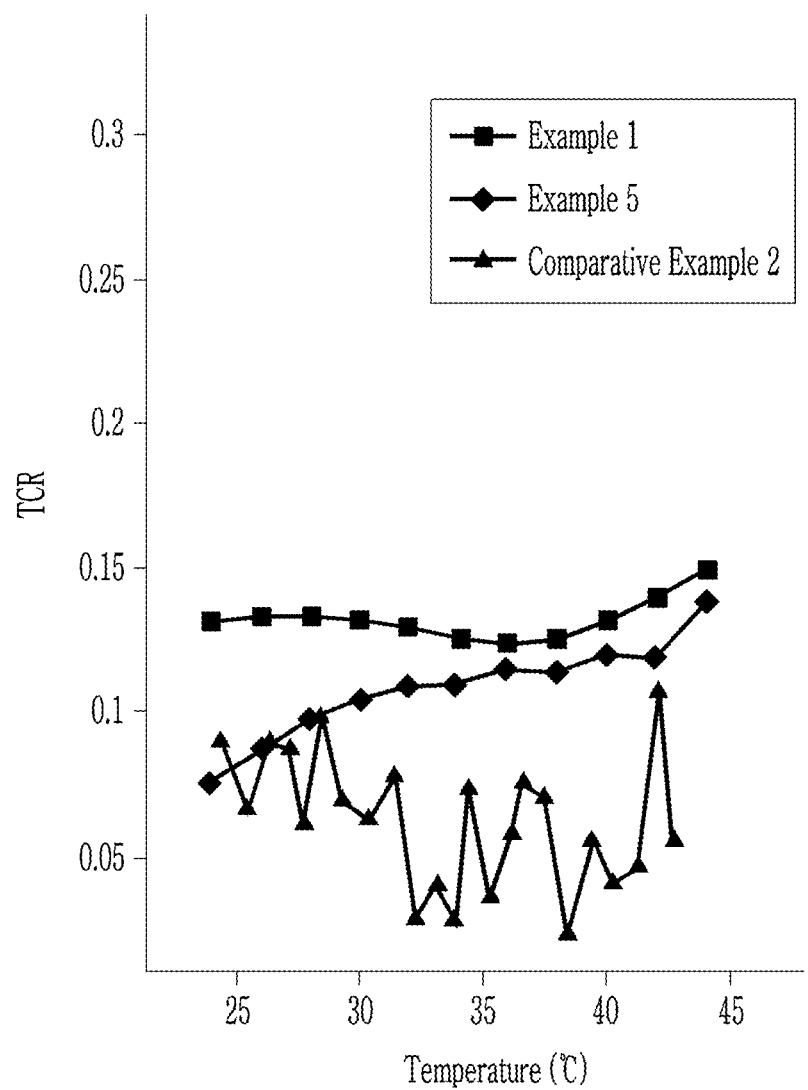
FIG. 13 is a graph showing the results of measuring temperature coefficient of resistance (TCR) according to temperature changes of thin films according to Example 1, Example 5, and Comparative Example 2.

TCR measurement results of the thin films of Examples 1 and 5 and Comparative Example 2 depending on the temperature change are shown in FIG. 13. FIG. 13 is a graph showing the results of measuring TCR according to temperature changes of thin films according to Examples 1 and 5 and Comparative Example 2. Referring to FIG. 13, the thin films of Examples 1 and 5 exhibit high TCR and a constant change and thus excellent temperature responsivity, but the thin film of Comparative Example 2 exhibits very irregular reactions depending on the temperature.

Evaluation 5: Infrared Absorption

Figure 14:
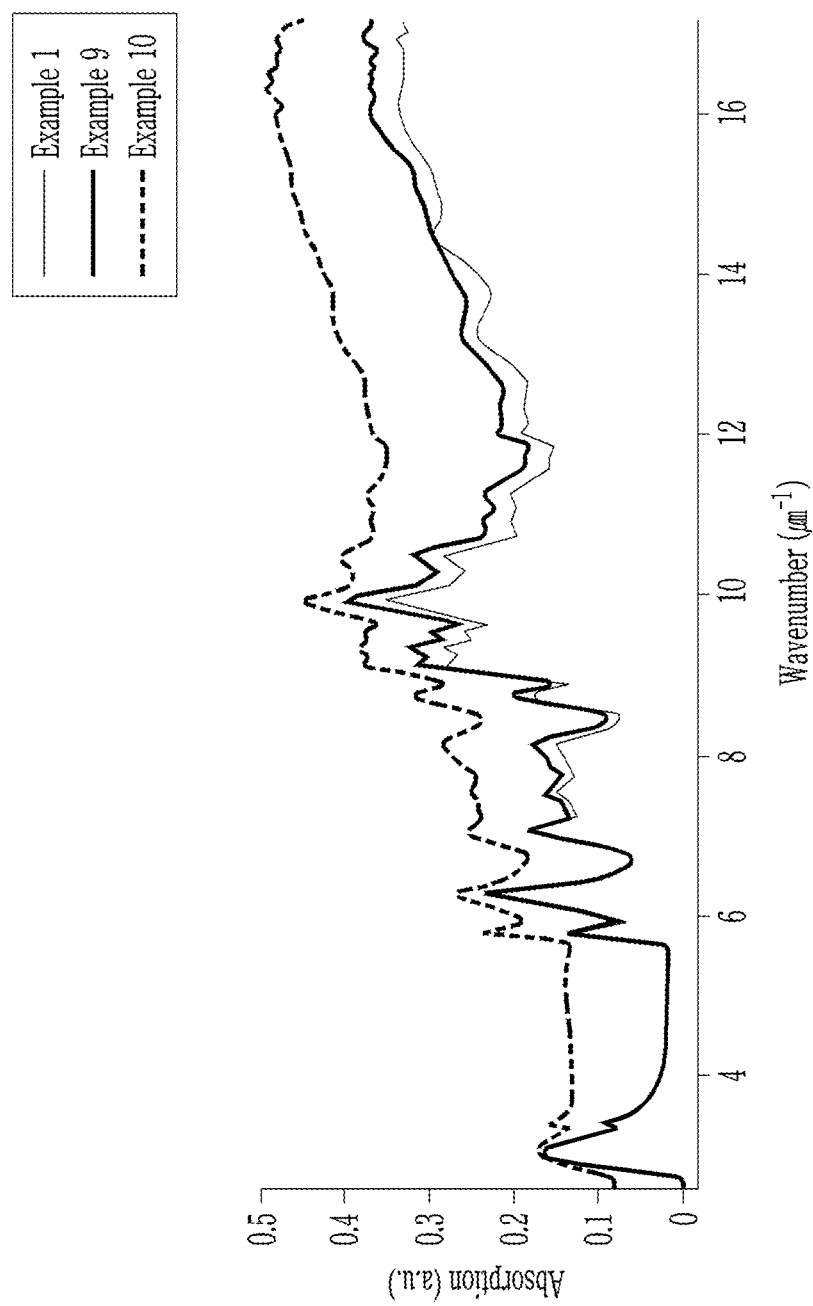
FIG. 14 is a graph showing infrared absorption of thin films according to Examples 1, 9, and 10.

Absorptions of the thin films of Examples 1 to 10 are evaluated by using a FT-IR spectrometer. The absorptions of the thin films of Examples 1, 9, and 10 are shown in FIG. 14. Referring to FIG. 14, the thin films of Examples 1, 9, and 10 exhibit excellent absorption in an infrared region.

While this disclosure has been described in connection with what is presently considered to be practical example embodiments, it is to be understood that the inventive concepts are not limited to the disclosed example embodiments. On the contrary, the inventive concepts are intended to cover various modifications and equivalent arrangements included within the spirit and scope of the appended claims.

What is claimed is:

1. An infrared absorber, comprising:
a composite, wherein the composite comprises
a polymer network including pectin or a pectin derivative;
a low-molecular compound having a hydrophilic group and a molecular weight of less than or equal to about 500 g/mol in the polymer network; and
a polyvalent metal ion coordinated with an anion present in a polymer chain of the polymer network,
wherein the low-molecular compound is an ethylene glycol, propylene glycol, butylene glycol, diethylene glycol, dipropylene glycol, glycerol, or a combination thereof,
wherein the low-molecular compound is included in the composite in an amount of greater than or equal to about 0.1 volume % and less than or equal to about 45 volume % based on a total volume of the composite.

2. The infrared absorber of claim 1, wherein the polymer chain is included in the composite in an amount of greater than or equal to about 50 volume % and less than or equal to about 99 volume % based on a total volume of the composite.

3. The infrared absorber of claim 1, wherein the low-molecular compound has a molecular weight of less than or equal to about 450 g/mol.

4. The infrared absorber of claim 1, wherein the polyvalent metal ion is a divalent metal ion or a trivalent metal ion.

5. The infrared absorber of claim 1, wherein the polyvalent metal ion includes Ca, Al, Cu, Co, Ba, Zn, Fe, Mn, Mg, Sr, Ba, Cr, Ti, Zr, Mo, V, or a combination thereof.

6. The infrared absorber of claim 1, wherein the polyvalent metal ion is included in the composite in an amount of greater than or equal to about 0.1 volume % and less than or equal to about 5 volume % based on the total volume of the composite.

7. The infrared absorber of claim 1, the composite further comprising:
a reinforcing agent, the reinforcing agent including graphite, carbon nanotubes, graphene, graphite nanoplates, fullerene, fullerene derivatives, quantum dots, metal oxides, or a combination thereof.

8. The infrared absorber of claim 7, wherein the reinforcing agent is included in the composite in an amount of less than or equal to about 5 volume % based on the total volume of the composite.

9. A thin film comprising the infrared absorber of claim 1.

10. An electronic device comprising the infrared absorber of claim 1.

11. A photoelectric device comprising:
a composite, wherein the composite comprises
a polymer network including pectin or a pectin derivative;
a low-molecular compound having a hydrophilic group and a molecular weight of less than or equal to about 500 g/mol in the polymer network; and
a polyvalent metal ion coordinated with an anion present in a polymer chain of the polymer network.

12. The photoelectric device of claim 11, wherein the polymer chain is included in the composite in an amount of greater than or equal to about 50 volume % and less than or equal to about 99 volume % based on a total volume of the composite.

13. The photoelectric device of claim 11, wherein the hydrophilic group is a hydroxyl group, a carboxyl group, an ester group, an ether group, an amine group, an amino group, an isocyanate group, or a urethane group.

14. The photoelectric device of claim 11, wherein the low-molecular compound is an organic compound in which at least one hydrophilic group is bound to a linear or branched C1 to C30 alkane, C3 to C30 cycloalkane, C3 to C30 heterocycloalkane, C6 to C30 arene, or C3 to C30 heteroarene, the at least one hydrophilic group including the hydrophilic group.

15. The photoelectric device of claim 11, wherein the low-molecular compound is an ethylene glycol, propylene glycol, butylene glycol, diethylene glycol, dipropylene glycol, glycerol, or a combination thereof.

16. The photoelectric device of claim 11, wherein the low-molecular compound has a molecular weight of less than or equal to about 450 g/mol.

17. The photoelectric device of claim 11, wherein the low-molecular compound is included in the composite in an amount of greater than or equal to about 0.1 volume % and less than or equal to about 45 volume % based on a total volume of the composite.

18. The photoelectric device of claim 11, wherein the polyvalent metal ion is a divalent metal ion or a trivalent metal ion.

19. The photoelectric device of claim 11, wherein the polyvalent metal includes Ca, Al, Cu, Co, Ba, Zn, Fe, Mn, Mg, Sr, Ba, Cr, Ti, Zr, Mo, V, or a combination thereof.

20. The photoelectric device of claim 11, wherein the polyvalent metal ion is included in the composite in an amount of greater than or equal to about 0.1 volume % and less than or equal to about 5 volume % based on a total volume of the composite.

21. The photoelectric device of claim 11, the composite further comprising:
   a reinforcing agent, the reinforcing agent including graphite, carbon nanotubes, graphene, graphite nanoplates, fullerene, fullerene derivatives, quantum dots, metal oxides, or a combination thereof.

22. The photoelectric device of claim 21, wherein the reinforcing agent is included in the composite in an amount of less than or equal to about 5 volume % based on a total volume of the composite.

* * * * *